United States Patent
Honda et al.

(10) Patent No.: US 9,899,796 B1
(45) Date of Patent: Feb. 20, 2018

(54) LASER DEVICE

(71) Applicant: FANUC CORPORATION, Yamanashi (JP)

(72) Inventors: Masahiro Honda, Yamanashi (JP); Yasuyuki Tanaka, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/666,185

(22) Filed: Aug. 1, 2017

(30) Foreign Application Priority Data

Aug. 18, 2016 (JP) ................................ 2016-160593

(51) Int. Cl.
*H01S 5/022* (2006.01)
*H01S 5/024* (2006.01)

(52) U.S. Cl.
CPC .......... *H01S 5/02407* (2013.01); *H01S 5/022* (2013.01); *H01S 5/02415* (2013.01); *H01S 5/02423* (2013.01); *H01S 5/02469* (2013.01)

(58) Field of Classification Search
CPC ............. H01S 5/02407; H01S 5/02415; H01S 5/02423; H01S 5/022; H01S 5/02469
See application file for complete search history.

(56) References Cited

U.S. PATENT DOCUMENTS

2017/0163005 A1* 6/2017 Takigawa .............. H01S 5/0014

FOREIGN PATENT DOCUMENTS

| JP | H05-333942 A | 12/1993 |
|---|---|---|
| JP | 2010-008321 A | 1/2010 |

* cited by examiner

*Primary Examiner* — Armando Rodriguez
(74) *Attorney, Agent, or Firm* — Studebaker & Brackett PC

(57) ABSTRACT

To provide a laser device allowing the prevention of dew formation on a cooler of the laser device, while contributing to a longer lifetime of a humidity sensor to be used. A laser device includes a laser diode and a cooler for cooling the laser diode. The laser diode and the cooler are provided in a housing. The laser device includes: a humidity detector that detects humidity in the laser device while current is applied to the humidity detector; and a current application controller that controls the time of current application to the humidity detector. In one aspect of the laser device, the laser device further includes: a temperature detector that detects a temperature in the housing; and a dew point calculator that calculates a dew point based on the humidity detected by the humidity detector, and the temperature detected by the temperature detector. The current application controller controls the time of current application to the humidity detector based on the dew point calculated by the dew point calculator.

4 Claims, 3 Drawing Sheets

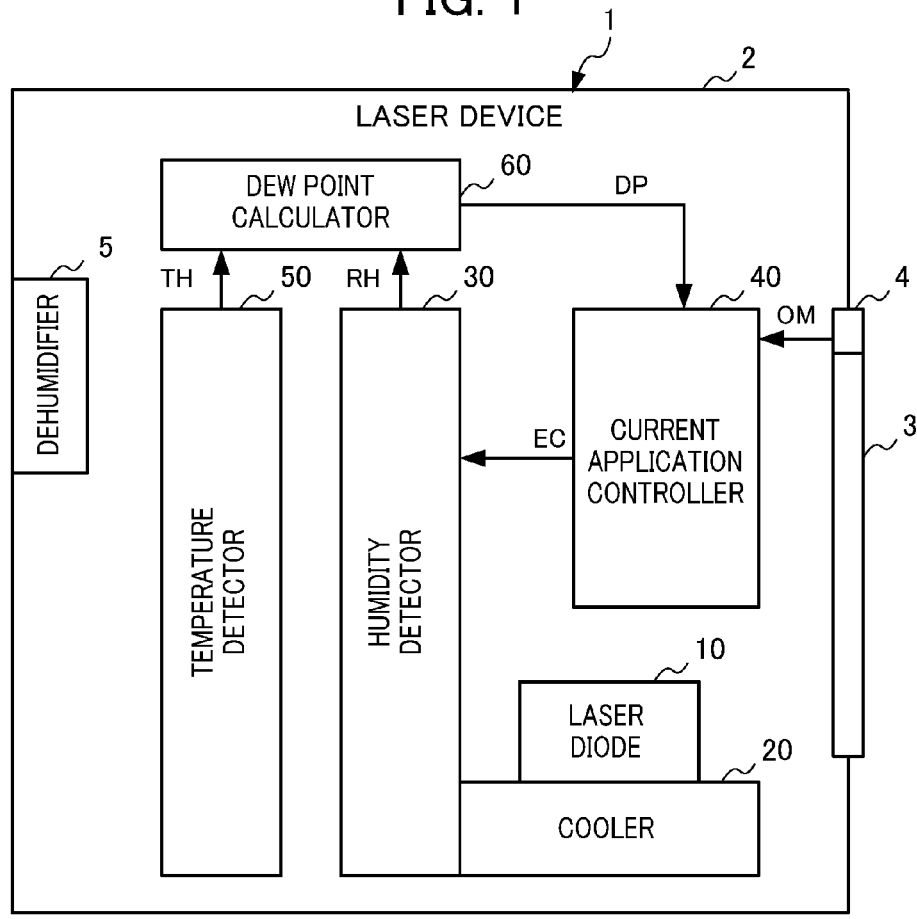
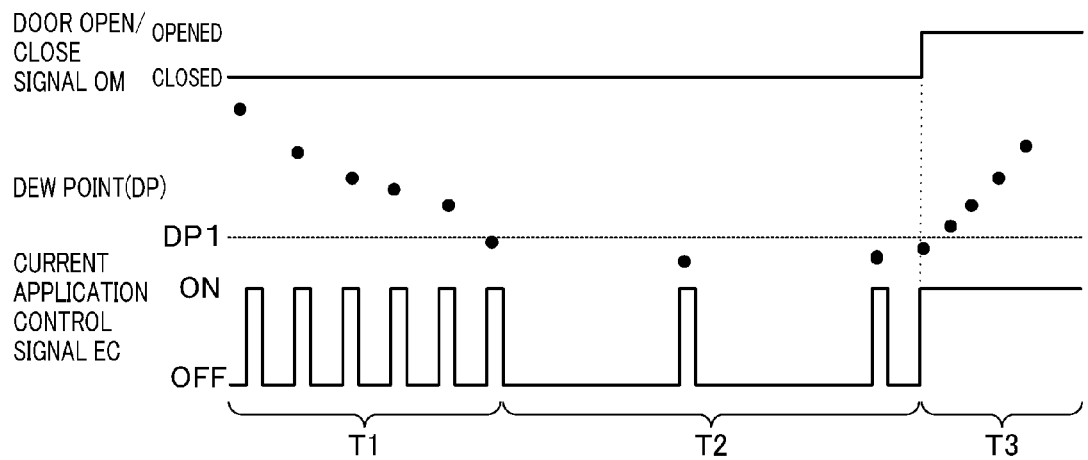

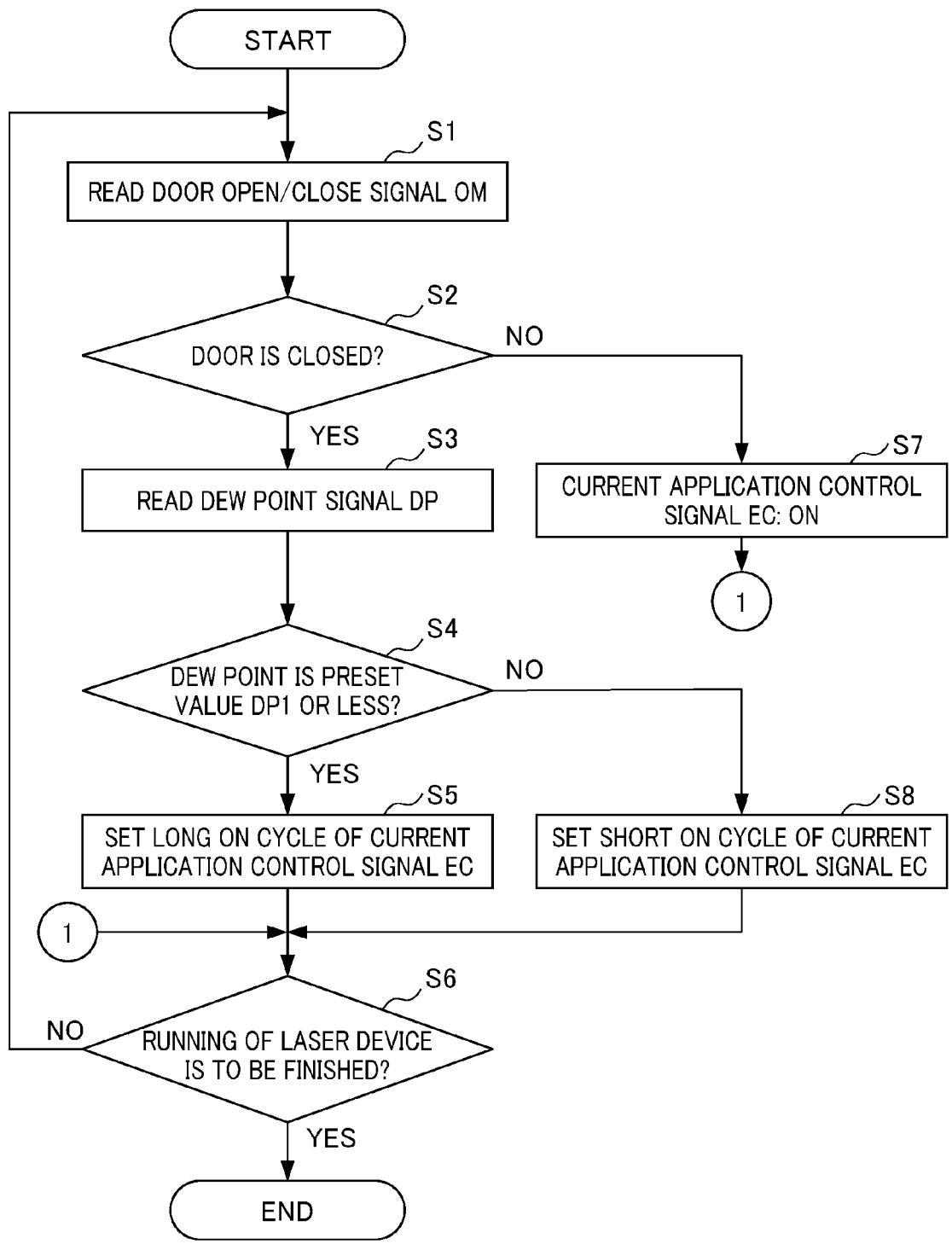

LASER DEVICE

This application is based on and claims the benefit of priority from Japanese Patent Application No. 2016-160593, filed on 18 Aug. 2016, the content of which is incorporated herein by reference.

BACKGROUND OF THE INVENTION

Field of the Invention

The present invention relates to a laser device, more specifically, to a laser device with a dehumidifier.

Related Art

In a high-power laser device, cooling has been carried out for preventing overheating of a laser diode as a laser beam source. Specifically, a cooler responsible for the cooling has been provided in the laser device. The laser device has generally been installed in an enclosed housing and humidity in the housing has been managed to be kept at a constant value by a unit having a dehumidifying function such as a cooler. If a door of the housing is opened for the purpose of a maintenance checkup, for example, the laser diode or a member around the laser diode in a cooled state will be exposed to high humidity air and form dew. Adherence of water droplets resulting from the dew to the laser diode has caused a risk of damage of the laser diode. Hence, humidity in the housing of the laser device has been required to be managed continuously with sufficient accuracy. For such management of humidity, a humidity sensor to be provided in the housing has been desired to have a sufficiently long lifetime, and to maintain stable detection accuracy.

A device for predicting the lifetime of a humidity sensor installed in a measurement location has conventionally been suggested (see patent document 1, for example). According to the technique described in patent document 1, for use of the humidity sensor, the humidity sensor is recovered from degraded performance by being heated in constant cycles, with a heater accompanying the humidity sensor. At the same time, heating time in each cycle is changed to acquire estimated total heating time data in a period of endurance. Further, cumulative value data of actual heating time is acquired. Based on the estimated data concerning the total heating time and the cumulative value data of the actual heating time, a predetermined calculation is carried out to predict the lifetime of the humidity sensor. Patent document 1 recites that, by predicting the lifetime of the humidity sensor in this way, preparation for regular exchange is made to allow maintenance to be carried out more conveniently.

There has also been a suggested technique for allowing detection accuracy of a humidity sensor accompanying an air conditioner to be maintained over a long period of time (see patent document 2, for example). According to the technique described in patent document 2, a current application stop period is set and the humidity sensor is actuated intermittently. If a detected humidity value goes out of a certain range, and if the detected humidity value changes at a rate not exceeding a certain rate while falling within a certain range during the intermittent actuation of the humidity sensor, the current application stop period is extended. Patent document 2 recites that extending the current application stop period shortens cumulative time of current application to the humidity sensor, thereby allowing detection accuracy to be maintained over a long period of time.

Patent Document 1: Japanese Unexamined Patent Application, Publication No. 2010-008321
Patent Document 2: Japanese Unexamined Patent Application, Publication No. H05-333942

SUMMARY OF THE INVENTION

According to the technique disclosed in patent document 1, the lifetime of the humidity sensor is predicted by a calculation based on the data concerning the time of heating of the humidity sensor, thereby allowing maintenance to be carried out more conveniently. However, patent document 1 does not describe a way of extending a lifetime itself. According to the technique disclosed in patent document 2, time of stop of current application to the humidity sensor is controlled based on a humidity value detected by the humidity sensor accompanying the air conditioner and a rate of change of the detected humidity value. However, in order to prevent dew formation on the cooler of the laser device, this technique cannot be applied as it is.

The present invention has been made in view of the aforementioned circumstances. It is an object of the present invention to provide a laser device allowing the prevention of dew formation on a cooler of the laser device, while contributing to a longer lifetime of a humidity sensor to be used.

(1) A laser device according to the present invention (laser device 1 described later, for example) includes a laser diode (laser diode 10 described later, for example) and a cooler (cooler 20 described later, for example) for cooling the laser diode. The laser diode and the cooler are provided in a housing (housing 2 described later, for example). The laser device includes: a humidity detector (humidity detector 30 described later, for example) that detects humidity in the laser device while current is applied to the humidity detector; and a current application controller (current application controller 40 described later, for example) that controls the time of current application to the humidity detector.

(2) The laser device according to (1) may further include: a temperature detector (temperature detector 50 described later, for example) that detects a temperature in the housing; and a dew point calculator (dew point calculator 60 described later, for example) that calculates a dew point based on the humidity detected by the humidity detector, and the temperature detected by the temperature detector. The current application controller may control time of current application to the humidity detector based on the dew point calculated by the dew point calculator.

(3) The laser device according to (1) or (2) may further include a door open/close detector (door open/close detector 4 described later, for example) that detects an open/close state of a door (door 3 described later, for example) of the housing. The current application controller may control time of current application to the humidity detector in response to the open/close state of the door detected by the door open/close detector.

(4) In the laser device according to any one of (1) to (3), the humidity detector may be provided near the cooler.

The present invention can realize a laser device allowing the prevention of dew formation on the cooler of the laser device, while contributing to a longer lifetime of a humidity sensor to be used.

BRIEF DESCRIPTION OF THE DRAWINGS

FIG. 1 schematically shows the configuration of a laser device according to an embodiment of the present invention;

FIG. 2 shows control over current application to a humidity detector exerted by a current application controller in the laser device shown in FIG. 1;

FIG. 3 is a flowchart showing the operation of the current application controller in the laser device shown in FIG. 1.

DETAILED DESCRIPTION OF THE INVENTION

Figure 4:
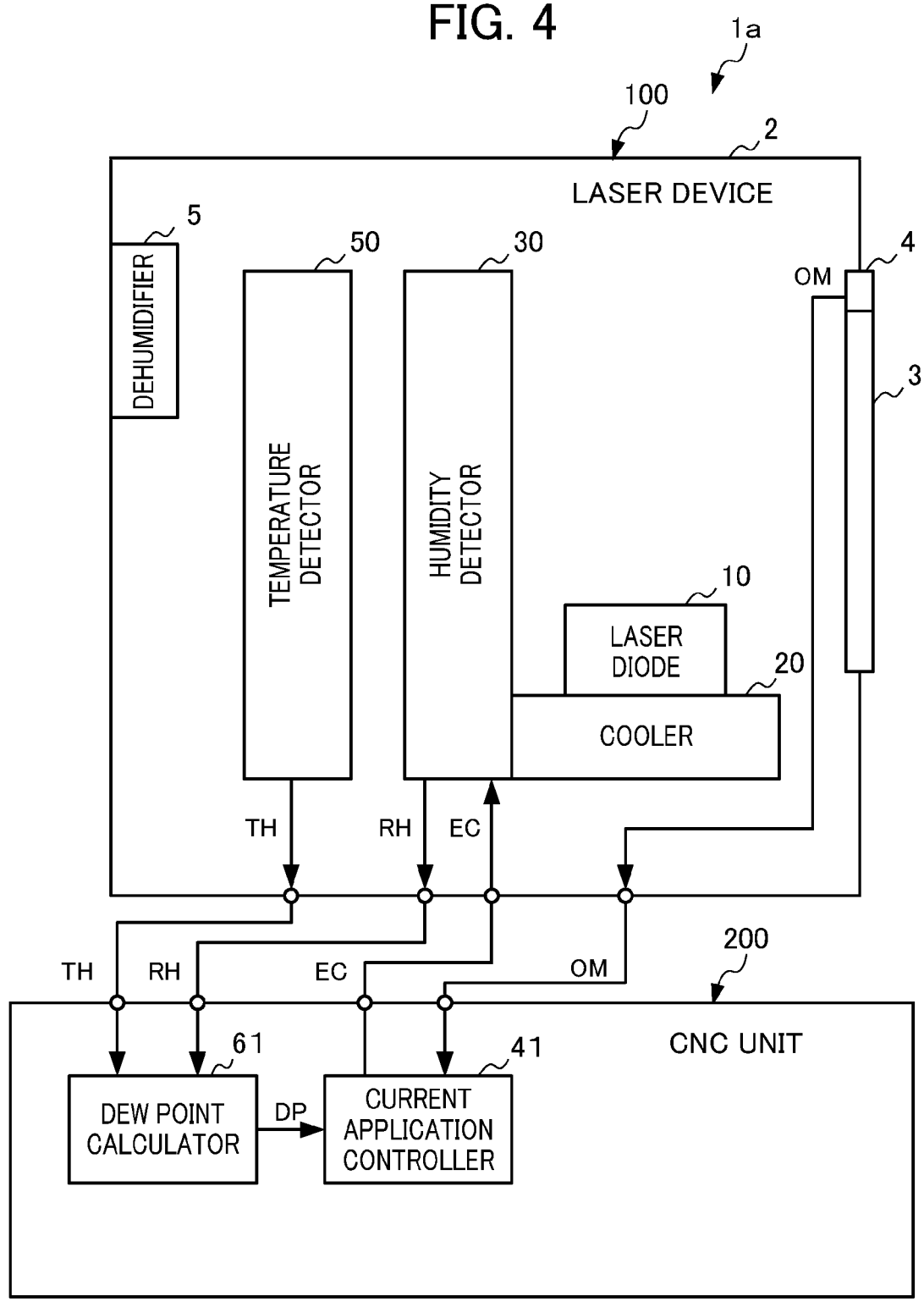
FIG. 4 schematically shows the configuration of a laser device according to a different embodiment of the present invention.

FIG. 1 schematically shows the configuration of a laser device according to an embodiment of the present invention. A laser device 1 includes a laser diode 10 and a cooler 20 for cooling the laser diode 10. The laser diode 10 and the cooler 20 are provided in a housing 2. Specifically, the laser diode 10 as a laser beam source is accompanied by the cooler 20 for cooling the laser diode 10. The laser diode 10 and the cooler 20 are provided in the enclosed housing 2. The cooler 20 can be a cooler of a type so as to make a coolant circulate in a liquid-cooled heat sink, or a type having an electron cooling element such as a Peltier element, for example.

The laser device 1 further includes a humidity detector 30 and a current application controller 40. The humidity detector 30 detects humidity in the laser device 1 (specifically, in the housing 2) while current is applied to the humidity detector 30. The current application controller 40 controls the time of current application to the humidity detector 30. Current application to the humidity detector 30 is a measure taken to recover (refresh) sensitivity of humidity detection through application of heat. By taking this measure, water retained at a humidity sensing member of a humidity sensor forming the humidity detector 30 is removed, thereby recovering detection sensitivity and removing hysteresis regarding output of detection. However, if cumulative time of this current application becomes extremely long, the humidity sensor comes to its end of life. The laser device 1 further includes a temperature detector 50 and a dew point calculator 60 that are provided in the housing 2. The temperature detector 50 detects a temperature in the housing 2. The dew point calculator 60 calculates a dew point based on the humidity detected by the humidity detector 30, and the temperature detected by the temperature detector 50.

The current application controller 40 controls the time of current application to the humidity detector 30 based on the dew point calculated by the dew point calculator 60. Specifically, based on the calculated dew point value, the current application controller 40 adjusts an average duty ratio of current application to the humidity detector 30 by changing cycles of current application having a constant duration, or by changing a duty ratio of current application in constant cycles. The housing 2 is provided with a door 3. The door 3 includes a door open/close detector 4 that detects an open/close state of the door 3. The current application controller 40 controls the time of current application to the humidity detector 30 in response to the open/close state of the door 3 detected by the door open/close detector 4.

In the laser device 1, the humidity detector 30 is provided at a position contacting the cooler 20 or near the cooler 20. This causes the humidity detector 30 to detect changes in humidity in neighboring spaces of the cooler 20 with high sensitivity and without long delay, thereby achieving favorable detection accuracy. In this case, instead of controlling time of current application to the humidity detector 30 in response to the calculated dew point, time of current application to the humidity detector 30 can be controlled based on such a highly accurate detected humidity value. The housing 2 is provided with a dehumidifier 5 for keeping humidity in the housing 2 at a low level. The performance of dehumidifying operation of the dehumidifier 5 is adjusted in response to a detected humidity value transmitted from the humidity detector 30. The dehumidifier 5 can be an electronic dehumidifier or a dehumidifier of a type of electrolyzing water with the use of a polyelectrolyte film, for example.

The dew point calculator 60 calculates a dew point in the housing 2 based on a humidity signal RH and a temperature signal TH, and outputs the calculated dew point as a dew point signal DP. The humidity signal RH is a signal indicating humidity in the housing 2 output from the humidity detector 30. The temperature signal TH is a signal indicating a temperature in the housing 2 output from the temperature detector 50. The dew point signal DP indicating the dew point calculated in the above-described manner by the dew point calculator 60 is input to the current application controller 40. A door open/close signal OM indicating the opening or closing of the door 3 detected by the door open/close detector 4 is further input to the current application controller 40. In response to the dew point signal DP and the door open/close signal OM input to the current application controller 40, the current application controller 40 supplies the humidity detector 30 with a current application control signal EC for controlling current application to the humidity detector 30. By supplying the current application control signal EC, a way of current application to water removing means (not shown in the drawings) of the humidity detector 30 is adjusted.

Adjustment of time of current application time by the current application controller 40 will be described next by referring to FIG. 2. FIG. 2 shows control over current application to the humidity detector 30 exerted by the current application controller 40 in the laser device 1 shown in FIG. 1. Current application to the humidity detector 30 is adjusted in response to a dew point in the housing 2. Multiple black dots shown with an indication "DEW POINT" on the left edge side of FIG. 2 mean dew points (° C.) in the housing 2 calculated by the dew point calculator 60. Specifically, the dew point calculator 60 outputs the dew point signal DP indicating a dew point in the housing 2. The reason for using multiple discrete black dots for representing dew points shown as the dew point signal DP is to show timing of each sampling (calculation) and sampled values. A dotted line drawn transversely relative to the multiple discrete dew points shows a preset value DP1 about a dew point. If a dew point is the preset value DP1 or less, a risk of dew formation in the housing 2 is low. Conversely, if a dew point exceeds the preset value DP1, a risk of dew formation in the housing 2 is caused.

Referring to FIG. 2, a period of time when a dew point shown as the dew point signal DP exceeds the preset value DP1 is called a period T1. A period of time when this dew point is the preset value DP1 or less is called a period T2. A period of time when the door open/close signal OM indicates that the door 3 is opened is called a period T3. In the period T1, a dew point in the housing 2 exceeds the preset value DP1 so the housing 2 is in an atmosphere where dew is relatively likely to be formed. Thus, the current application control signal EC supplied from the current application controller 40 to the humidity detector 30 is set to have a constant ON duration and short ON occurrence cycles. In response to the supply of this current application control signal EC, the humidity detector 30 applies current to the water removing means (not shown in the drawings) at a relatively high frequency. By applying current to the water removing means at the relatively high frequency, sensitivity reduction due to excessive absorption of water is prevented, and hysteresis regarding output of detection is removed. As a result, the humidity detector 30 is able to maintain the accuracy of the humidity signal RH.

In the period T2, a dew point in the housing 2 is the preset value DP1 or less, so the housing 2 is in an atmosphere where dew is relatively unlikely to be formed. Thus, the current application control signal EC supplied from the current application controller 40 to the humidity detector 30 is set to have a constant ON duration and long ON occurrence cycles. In response to supply of this current application control signal EC, the humidity detector 30 applies current to the water removing means (not shown in the drawings) at a relatively low frequency. By applying current to the water removing means even at the relatively low frequency, sensitivity reduction due to excessive absorption of water can still be prevented, and hysteresis regarding output of detection can still be removed. In this way, time of current application to the humidity detector 30 for recovering (refreshing) sensitivity is shortened. In this state, the humidity detector 30 is able to maintain the accuracy of the humidity signal RH. As a result, while the humidity detector 30 is used, current is not applied to the humidity detector 30 at an excessively high frequency. Thus, shortening of the lifetime of the humidity detector 30 due to accumulation of time of current application is prevented.

In the period T3, the door 3 of the housing 2 of the laser device 1 is opened. Hence, dew might be formed rapidly in the housing 2. Thus, if the current application controller 40 determines that the door 3 is opened based on the door open/close signal OM, the current application controller 40 immediately turns on the current application control signal EC and maintains a state where the current application control signal EC is on. By doing so, the humidity detector 30 maintains a state of applying current to the water removing means (not shown in the drawings), so that sensitivity reduction due to excessive absorption of water is prevented, and hysteresis regarding output of detection is removed. As a result, even if the door 3 of the housing 2 is opened, the humidity detector 30 is still able to maintain the accuracy of the humidity signal RH to detect dew formation immediately.

The control operation of the current application controller 40 in the laser device 1 will be described next by referring to a flowchart. FIG. 3 is a flowchart showing the control operation of the current application controller 40 in the laser device shown in FIG. 1. When the operation is started, the current application controller 40 reads the door open/close signal OM from the door open/close detector 4 (step S1). Next, the current application controller 40 determines whether the door 3 is opened or closed based on the read door open/close signal OM (step S2). If the door 3 is determined to be closed in step S2 (step S2: YES), the current application controller 40 reads the dew point signal DP from the dew point calculator 60 (step S3). Next, the current application controller 40 determines whether or not the value of the read dew point signal DP is the preset value DP1 or less (step S4).

If the value of the dew point signal DP is determined to be the preset value DP1 or less in step S4 (step S4: YES), the current application controller 40 sets long ON cycles of the current application control signal EC (step S5). After step S5, the current application controller 40 determines whether or not action for finishing the running of the laser device 1 has been made based on, for example, a history of action on an operation unit of the laser device 1 not shown in the drawings (step S6). If it is determined in step S6 that action for finishing the running of the laser device 1 has been made (step S6: YES), the current application controller 40 finishes the operation. If it is determined in step S6 that the laser device 1 is running (step S6: NO), the flow returns to step S1 to repeat the above-described operation.

If the door 3 is determined to be opened in step S2 (step S2: NO), the current application controller 40 sets the current application control signal EC so as to maintain the current application control signal EC in an ON state (step S7). After step S7, the flow jumps to step S6 described above. If the value of the dew point signal DP is determined to exceed the preset value DP1 in step S4 (step S4: NO), the current application controller 40 sets short ON cycles of the current application control signal EC (step S8). After step S8, the flow shifts to step S6 described above.

As clearly understood from the foregoing description given by referring to the flowchart of FIG. 3, the current application controller 40 first reads the door open/close signal OM from the door open/close detector 4 to determine whether the door 3 is opened or closed. If the door 3 is opened (step S2: NO), the current application controller 40 unconditionally sets the current application control signal EC so as to maintain the current application control signal EC in an ON state (step S7). In this way, if the door 3 is opened, the current application controller 40 exerts control so as to continue current application to the humidity detector 30 regardless of whether or not other conditions are satisfied. Thus, at this time, the dew point calculator 60 is not required to execute a process to calculate a dew point. Further, as current application to the humidity detector is maintained, the humidity detector 30 maintains a state of applying current to the water removing means (not shown in the drawings). Thus, as described above by referring to FIG. 2, sensitivity reduction due to excessive absorption of water is prevented, and hysteresis regarding output of detection is removed. As a result, even if the door 3 of the housing 2 is opened, the humidity detector 30 is still able to maintain the accuracy of the humidity signal RH.

If the door 3 is closed (step S2: YES), the current application controller 40 determines whether or not a dew point is the preset value DP1 or less. If the dew point is low, a risk of dew formation is low. Thus, the current application controller 40 sets long ON cycles of the current application control signal EC (step S5). In other words, this setting in step S5 is to extend time of stop of current application to the humidity detector 30. By doing so, cumulative time of current application to the humidity detector 30 is shortened to extend the lifetime of the humidity detector 30. According to the above-described embodiment, cumulative time of current application to the humidity detector 30 is shortened by setting the current application control signal EC so as to achieve a constant duration in all ON cycles and long ON occurrence cycles. Alternatively, if an average ON duty of the current application control signal EC is reduced relatively, cumulative time of current application to the humidity detector 30 can also be shortened while various waveforms are generated for a current application signal.

A laser device according to a different embodiment of the present invention will be described next by referring to FIG. 4. FIG. 4 schematically shows the configuration of the laser device according to the different embodiment of the present invention. In a laser device 1a shown in FIG. 4 according to this embodiment, current application to the humidity detector 30 in a laser device unit 100 is controlled by a CNC unit 200. In FIG. 4, units corresponding to those described above by referring to FIG. 1 are identified by the same signs. Such corresponding units will not be described individually. The current application controller 40 and the dew point calculator 60 in the laser device 1 described above by referring to FIG. 1 are not provided in the laser device unit 100 shown in FIG. 4. Functional units corresponding to the current application controller 40 and the dew point calculator 60 are provided as a current application controller 41 and a dew point calculator 61 respectively in the CNC unit 200. The current application controller 41 and the dew point calculator 61 can be configured mainly by using a CPU of the CNC unit 200 (not shown in the drawings) and software. Alternatively, the current application controller 41 and the dew point calculator 61 can be hardware units configured separately by using respective circuit units.

Like the dew point calculator 60 shown in FIG. 1, the dew point calculator 61 in the CNC unit 200 receives the temperature signal TH and the humidity signal RH input from the temperature detector 50 and the humidity detector 30 respectively. Based on the input temperature signal TH and humidity signal RH, the dew point calculator 61 calculates a dew point (DP). The dew point signal DP indicating the calculated dew point is input to the current application controller 41 in the CNC unit 200. The current application controller 41 receives the door open/close signal OM in addition to the above-described dew point signal DP. Based on the input dew point signal DP and door open/close signal OM, the current application controller 41 generates the current application control signal EC in the same way as the current application controller 40 shown in FIG. 1, and supplies the generated signal EC to the humidity detector 30. Specifically, the current application controller 41 controls current application to the humidity detector 30 in response to a dew point in a housing in the same way as that described above by referring to FIG. 2. The operation of the current application controller 41 is the same as that described above by referring to the flowchart of FIG. 3. Thus, the laser device 1a according to the embodiment shown in FIG. 4 achieves working effect comparable to that achieved by the laser device 1 described above by referring to FIG. 1.

The working effect achieved by the laser device according to the embodiment of the present invention described above by referring to FIGS. 1 to 4 is summarized as follows.

(1) The laser device 1 according to the present invention includes the laser diode 10 and the cooler 20 for cooling the laser diode 10. The laser diode 10 and the cooler 20 are provided in the housing 2. The laser device 1 includes the humidity detector 30 and the current application controller 40 or 41. The humidity detector 30 detects humidity in the laser device 1 while current is applied to the humidity detector 30. The current application controller 40 or 41 controls the time of current application to the humidity detector 30.

In the laser device 1 according to (1), the current application controller 40 or 41 drives the humidity detector 30 intermittently. Thus, degradation of the humidity detector 30 can be reduced.

(2) In one aspect of the laser device 1 according to the present invention, the laser device 1 further includes: the temperature detector 50 that detects a temperature in the housing 2; and the dew point calculator 60 or 61 that calculates a dew point based on the humidity detected by the humidity detector 30, and the temperature detected by the temperature detector 50. The current application controller 40 or 41 controls the time of current application to the humidity detector 30 based on the dew point calculated by the dew point calculator 60.

In the laser device 1 according to (2), the probability of dew formation is determined based on the dew point calculated by the dew point calculator 60 or 61. If there is no probability of dew formation, time of stop of current application to the humidity detector 30 is extended. Thus, degradation of the humidity detector 30 can be reduced.

(3) In one aspect of the laser device 1 according to the present invention, the laser device 1 further includes the door open/close detector 4 that detects an open/close state of the door 3 of the housing 2. The current application controller 40 or 41 controls the time of current application to the humidity detector 30 in response to the open/close state of the door 3 detected by the door open/close detector 4.

In the laser device 1 according to (3), if the door 3 is opened, control is exerted so as to continue current application to the humidity detector 30 regardless of whether or not other conditions are satisfied. Thus, at this time, the dew point calculator 60 or 61 is not required to execute a process to calculate a dew point.

(4) In one aspect of the laser device 1 according to the present invention, the humidity detector 30 is provided near the cooler 20.

In the laser device 1 according to (4), the humidity detector 30 detects changes in humidity in neighboring spaces of the cooler 20 with high sensitivity, thereby achieving favorable detection accuracy. In summary, the laser device 1 or 1a according to the present invention is capable of preventing dew formation on the cooler 20 of the laser device 1 by adjusting the dehumidifying performance of the dehumidifier 5 in operation appropriately based on output of detection from the humidity detector 30, while contributing to a longer lifetime of the humidity detector 30 to be used as a humidity sensor. It should be noted that the present invention is not to be limited to the above-described embodiment but various modifications or changes of the present invention can be implemented. Regarding the humidity signal RH indicating humidity detected by the humidity detector 30, for example, the humidity signal RH is input to the dew point calculator 60 or 61 for calculation of a dew point according to the above-described embodiment. If the humidity signal RH indicates an abnormally high dew point, an alarm may be issued. It should be noted that other modifications or improvements within a scope that can achieve the object of the present invention are included in the present invention.

EXPLANATION OF REFERENCE NUMERALS 1, 1a Laser device
2 Housing
3 Door
4 Door open/close detector
5 Dehumidifier
10 Laser diode
20 Cooler
30 Humidity detector
40, 41 Current application controller
50 Temperature detector
60, 61 Dew point calculator
100 Laser device unit
200 CNC unit

What is claimed is:
1. A laser device comprising a laser diode and a cooler for cooling the laser diode, the laser diode and the cooler being provided in a housing, the laser device comprising:

a humidity detector that detects humidity in the laser device while current is applied to the humidity detector; and a current application controller that controls the time of current application to the humidity detector.

2. The laser device according to claim 1, further comprising:

a temperature detector that detects a temperature in the housing; and a dew point calculator that calculates a dew point based on the humidity detected by the humidity detector, and the temperature detected by the temperature detector, wherein the current application controller controls the time of current application to the humidity detector based on the dew point calculated by the dew point calculator.

3. The laser device according to claim 1, further comprising a door open/close detector that detects an open/close state of a door of the housing, wherein the current application controller controls the time of current application to the humidity detector in response to the open/close state of the door detected by the door open/close detector.

4. The laser device according to claim 1, wherein the humidity detector is provided near the cooler.

* * * * *